(12) United States Patent
Chen

(10) Patent No.: US 7,054,216 B2
(45) Date of Patent: May 30, 2006

(54) PROGRAMMABLE MOS DEVICE FORMED BY HOT CARRIER EFFECT

(75) Inventor: Chung-Hui Chen, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 195 days.

(21) Appl. No.: 10/803,785

(22) Filed: Mar. 17, 2004

(65) Prior Publication Data

US 2005/0207211 A1    Sep. 22, 2005

(51) Int. Cl.
*G11C 7/00* (2006.01)

(52) U.S. Cl. ........................... 365/225.7; 365/96

(58) Field of Classification Search ............ 365/225.7, 365/96, 154, 189.11
See application file for complete search history.

(56) References Cited

U.S. PATENT DOCUMENTS

| | | | |
|---|---|---|---|
| 5,812,477 A * | 9/1998 | Casper et al. ............ 365/225.7 |
| 6,208,549 B1 | 3/2001 | Rao et al. .................... 365/96 |
| 6,436,738 B1 | 8/2002 | Yu ............................. 438/132 |
| 6,445,606 B1 | 9/2002 | Khoury ....................... 365/96 |
| 6,507,087 B1 | 1/2003 | Yu ............................. 257/529 |
| 6,781,916 B1 * | 8/2004 | McClure ................ 365/230.03 |
| 6,903,436 B1 * | 6/2005 | Luo et al. ................... 257/529 |
| 2005/0207223 A1 * | 9/2005 | Taheri et al. .......... 365/185.08 |

* cited by examiner

Primary Examiner—Anh Phung
(74) Attorney, Agent, or Firm—Duane Morris LLP

(57) ABSTRACT

A programmable metal-oxide-semiconductor (MOS) memory circuit and the method for programming same and disclosed. The circuit comprises a first N-type transistor having a gate region tied with a drain region and connectable to a first control voltage level, and a source region connected to a second voltage level; and a second N-type transistor having a gate region tied with a drain region and connectable to the first control voltage level, and a source region connected to the second voltage level, wherein the first and second control voltage levels are imposed to program either the first or second N-type transistor by causing a voltage difference between the drain region and the source region (Vds) and voltage difference between the gate region and the source region (Vgs) to be bigger than a predetermined threshold voltage to induce a hot carrier effect.

16 Claims, 3 Drawing Sheets

PROGRAMMABLE MOS DEVICE FORMED BY HOT CARRIER EFFECT

BACKGROUND OF THE DISCLOSURE

The present invention relates generally to the field of semiconductor devices, and more particularly to memory devices. Still more particularly, the invention relates to methods for programming semiconductor memory devices by stressing metal oxide semiconductor field effect transistors (MOSFETs) devices to cause hot carrier effect.

Typically, a MOSFET device may be fabricated upon a semiconductor substrate by forming a gate oxide, on top of which a gate electrode resides, and a pair of source/drain electrodes which adjoin the gate oxide and the gate electrode. The method by which a MOSFET device may be fabricated may vary from time to time, as understood by those skilled in the art.

Hot carrier effect is a phenomenon resulting from the injection of charge carriers into gate dielectric layers typically formed of silicon oxide formed beneath gate electrode edges within MOSFET devices. Along with other characteristics, the hot carrier effect within a MOSFET device is manifested by transistor parameters such as sub-threshold current and threshold voltage. In particular, when a MOSFET device is stressed under hot carrier effect, sub-threshold current typically increases while threshold voltage drifts. These drifts in device parameters are caused by the injection of charge carriers from the semiconductor substrate, on top of which a MOSFET device is formed, into the gate oxide of the MOSFET device. Depending on the design parameters of the MOSFET device, the injected charge carriers may generate more interface states within the gate oxide or they may be trapped by mid-gap states of the gate oxide.

Typically, many factors can affect the extent to which hot carrier effect is exhibited in MOSFET devices. These factors include but are not limited to the polarity of the MOSFET device, the hardness of the interface to the injected charge carriers, the trap density within the gate oxide and the potential barrier to charge carrier injection provided by the semiconductor substrate/gate oxide interface. Hot carrier effect can also be enhanced in MOSFET devices where gate dielectric layer thickness as well as channel widths are reduced while operating voltage is maintained. The reduction in gate dielectric layer thickness and channel widths within MOSFET devices at constant operating voltage typically provides an increase in electric field gradients at gate electrode edges within the devices. This increase in electric field gradients allow more charge carriers to be injected into and trapped in the semiconductor substrate and the gate oxide regions beneath gate electrode edges, or the gate dielectric layers.

When charge carriers are fully injected into and trapped in the semiconductor substrate and gate dielectric layers of the MOSFET device, the device is said to be stressed. In a condition wherein hot carrier effect is enhanced and amplified by adjusting the factors mentioned hitherto, electric charge builds up to a point where the semiconductor substrate and gate dielectric layers in the MOSFET device become stressed. As the MOSFET device becomes more stressed, the conductance of the device reduces, thereby exhibiting higher resistance. This resistance remains high until the electrons trapped in the semiconductor substrate and gate dielectric layers in the MOSFET device are removed.

Desirable in the art of semiconductor memory design are additional methods and materials through which one-time programming of non-volatile data can be achieved.

SUMMARY OF THE DISCLOSURE

In view of the foregoing, this disclosure provides a programmable metal-oxide-semiconductor (MOS) memory circuit and the method for programming the same.

In one example, the circuit comprises a first N-type transistor having a gate region tied with a drain region and connectable to a first control voltage level, and a source region connected to a second voltage level; and a second N-type transistor having a gate region tied with a drain region and connectable to the first control voltage level, and a source region connected to the second voltage level, wherein the first and second control voltage levels are imposed to program either the first or second N-type transistor by causing a voltage difference between the drain region and the source region (Vds) and voltage difference between the gate region and the source region (Vgs) to be bigger than a predetermined threshold voltage to induce a hot carrier effect.

DETAILED DESCRIPTION

Figure 1:
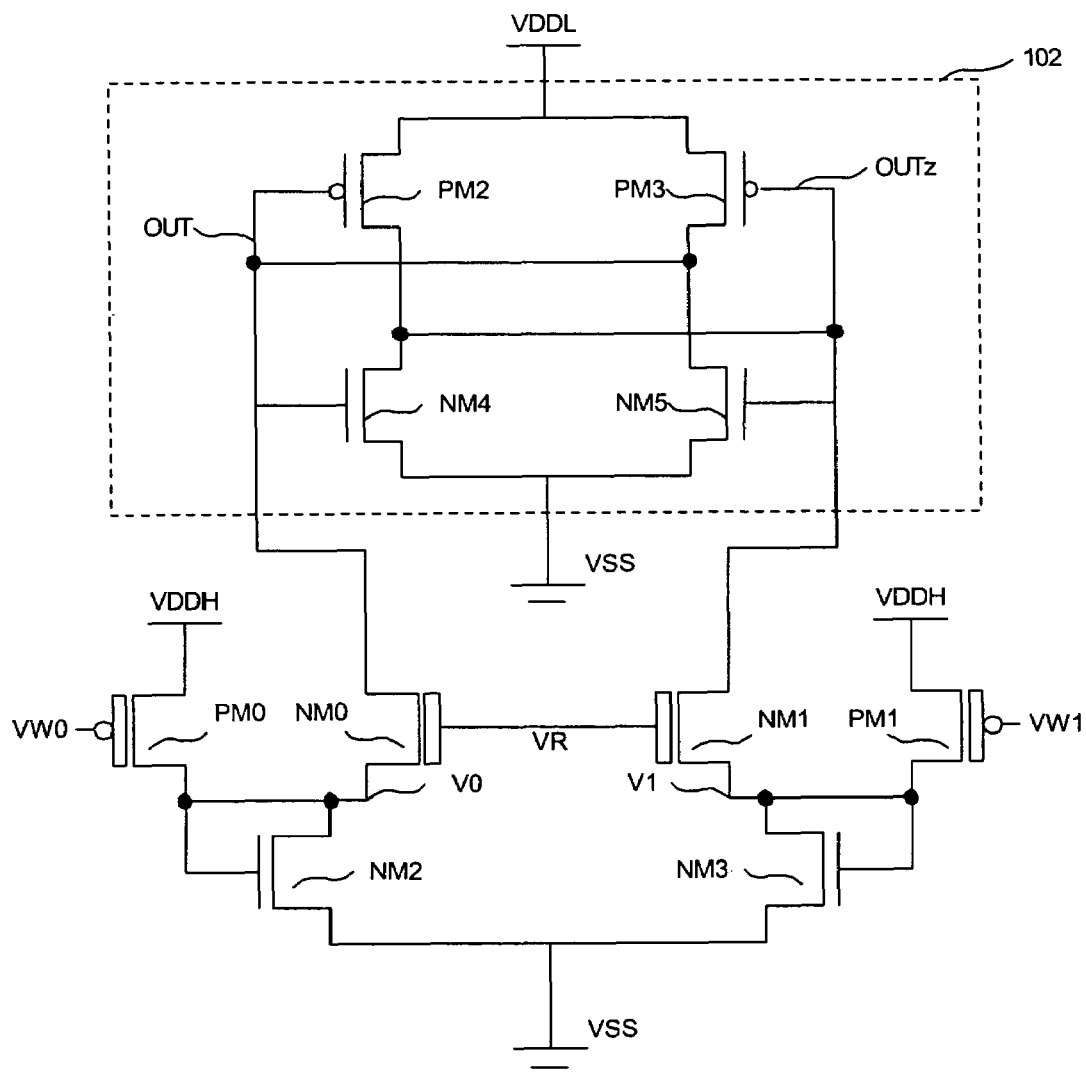
FIG. 1 illustrates a memory device in accordance with one example of the present disclosure.

In the present disclosure, a memory device using hot carrier effect to program two N-type metal-oxide-semiconductor (MOS) devices is disclosed. FIG. 1 shows a memory device 100 that can be programmed by utilizing the hot carrier effect. The device 100 includes a latch 102, two thick gate oxide P-type devices PM0 and PM1 that perform write operations, two thick gate oxide N-type devices NM0 and NM1 that perform read operations, and two one-time programmable thin gate oxide N-type devices NM2 and NM3. The latch 102 includes four transistors, two P-type devices PM2 and PM3, and two N-type devices NM4 and NM5. Thick gate devices are used in this memory device because the devices have to withstand a voltage typically higher than a regular operating voltage in order to successfully inject enough carrier charges into the two thin gate oxide devices NM2 and NM3 to achieve the hot carrier effect. If PM0 and PM1 break down before enough carrier charges are injected to NM2 and NM3, programming cannot be performed. The gate oxide devices have shorter channel than the thick gate oxide devices with a high electric field when stressed by the hot carrier effect.

The sources of PM0 and PM1 are connected to a high operating voltage VDDH, which is typically higher than a regular operating voltage, for the reason previously described. For example, VDDH is 3.3V and the threshold voltage to achieve hot carrier effect is 1.2V, while regular operating voltage is less than 1V. The drains of PM0 and PM1 are connected to both the gates and drains of NM2 and NM3, respectively, and further connected to the sources of NM0 and NM1, respectively. For illustration purposes, control voltage levels/references at the drains of PM0 and PM1 are referred to as V0 and V1, respectively. Similarly, the two nodes VW0 and VW1 represent the gates of PM0 and PM1, respectively, for programming the memory device.

The sources of NM2 and NM3 are connected to a control voltage level such as VSS which, depending on circuit setup, may or may not be directly connected to ground. The gates of NM0 and NM1 are connected together, the connection of which has a voltage reference VR. The drain of NM0 connects to the gates of PM2 and NM4, while the drain of NM1 connects to the gates of PM3 and NM5. NM0 and NM1 can be together viewed as a connection module which passes V0 and V1 as two inputs to the latch 102 when VR is set at an appropriate level. The sources of PM2 and PM3 are connected to an operating voltage VDDL, while the drains of PM2 and PM3 are connected to the drains of NM4 and NM5, respectively. The sources of NM4 and NM5 are connected to VSS. The gates of PM2 and NM4 are connected to the drains of PM3 and the drain of NM5, whereupon this connection has an output voltage reference OUT. The gates of PM3 and NM5 are connected to the drain of PM2 and the drain of NM4, whereupon this connection has an output voltage reference OUTz.

Figure 2A:
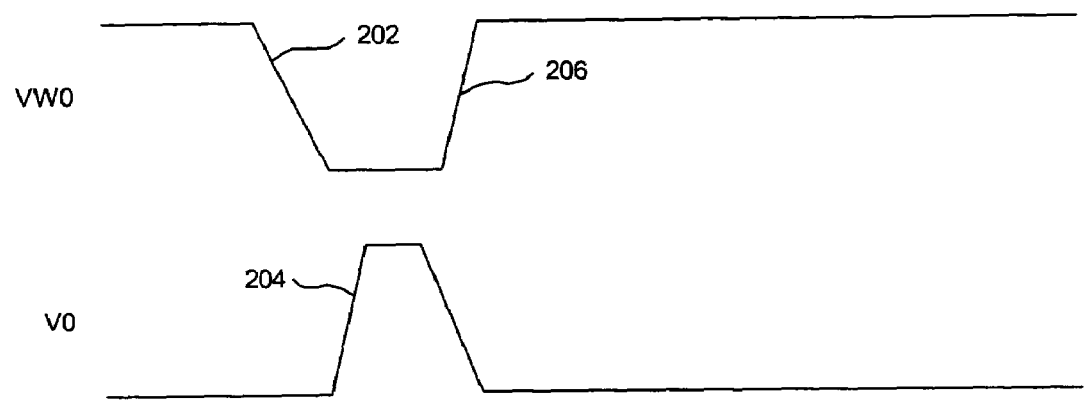
FIG. 2A illustrates a timing diagram showing the voltage at two nodes during a write operation in accordance with a first example of the present disclosure.

For illustration purposes, in a first example, the memory device 100 will be programmed with a "1." FIG. 2A illustrates a timing diagram showing the voltage at various nodes in FIG. 1 during an operation to program the memory device with a "1." With reference to both FIGS. 1 and 2A, when the circuit is powered up, both VW0 and VW1 are at VDDH whereas VR is at VSS. When a write operation occurs, VW0 is temporarily switched to 0 from VDDH, thereby allowing PM0 to conduct while VW1 stays at VDDH. The switch at VW0 is represented by a falling edge 202. V0 is then built up to VDDH, as represented by a rising edge 204, thereby building up carrier charges in NM2 until there is a high electric field between the drain and source of NM2. When a voltage difference between the drain region and the source region (Vds) and a voltage difference between the gate region and the source region (Vgs) is bigger than a predetermined threshold voltage, the hot carrier effect is caused. Due to hot carrier effect, the current (Ids) going through NM2 becomes lower relative to that going through NM3. NM2 will now have a low conductance and a high resistance, and is considered "programmed". When VW0 is switched back to VDDH, as represented by a rising edge 206, PM0 ceases to conduct. Throughout this period, since VW1 remains at VDDH, PM1 does not conduct and therefore no hot carrier charges are built up in NM3. As such, the thin gate oxide devices function as one-time programmable fuses due to the hot carrier effect.

Figure 2B:
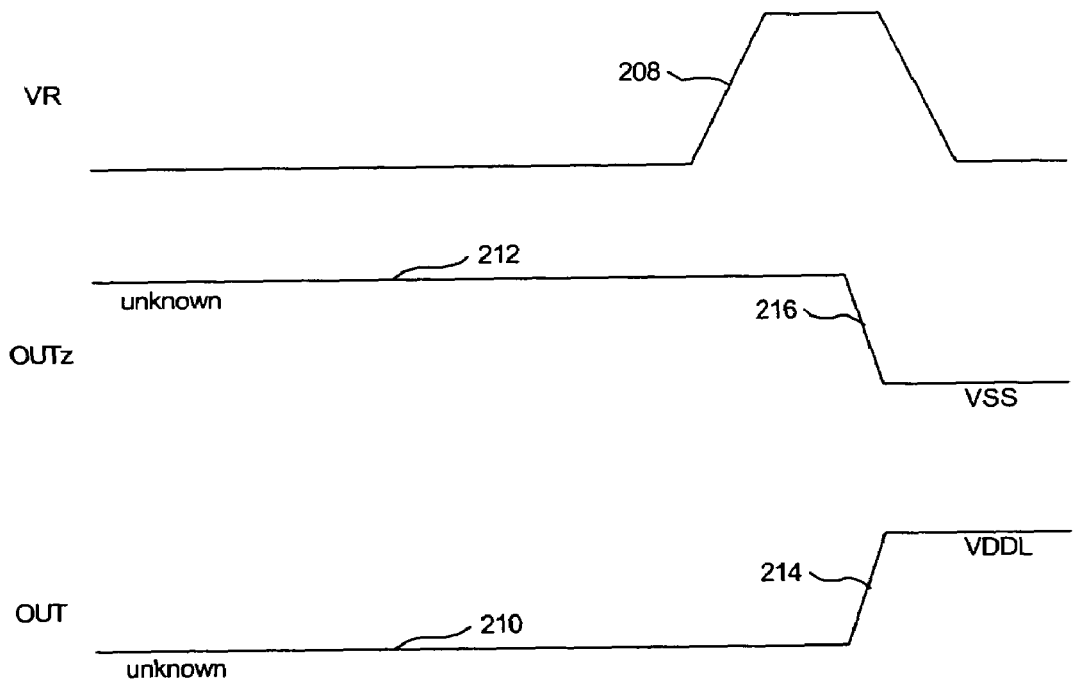
FIG. 2B illustrates a timing diagram showing the voltage at various nodes during a read operation in accordance with the first example of the present disclosure.

FIG. 2B illustrates a timing diagram showing the voltage at various nodes in FIG. 1 during a read operation. With reference to both FIGS. 1 and 2B, when a read operation occurs, VR rises, which is represented by a rising edge 208. It is noted that before a reading operation occurs, both OUT and OUTz are still indeterminate. When VR rises enough, NM0 and NM1 conduct, thereby sending V0 and V1 to OUT and OUTz, respectively. In this example, OUT, which carries V0, is higher than OUTz, which carries V1. As such, OUT will move to as high a voltage as VDDL, as represented by a rising edge 212, while OUTz stays at VSS. The data of the memory device can be obtained by reading OUT, which essentially carries the "1" that is originally programmed into NM2. Based on the function of the latch 102 in this configuration, it can be viewed as a comparison circuit which compares V0 and V1, and produces an output on OUT node accordingly.

When the VR signal is turned off, both NM0 and NM1 stop conducting, thereby disconnecting OUT from V0 and OUTz from V1. At this point, the latch 102 will force OUT to move to VDDL if it is higher than OUTz. Conversely, the latch 102 will force OUT to move to VSS if it is lower than OUTz. In this example, since the voltage potential at OUT is higher than the voltage potential at OUTz just prior to when the VR signal is turned off, the latch 102 will force OUT to VDDL and OUTz to VSS.

Since the latch 102 will always move OUT away from OUTz after a read operation, OUTz is essentially a negation of OUT after a read operation. It is also noted that before a read operation, the states of OUT and OUTz are indeterminate. Since the latch 102 will also hold the information of the memory device at OUT after a read operation is completed, the latch 102 in effect is a memory cell that either holds a "1" or "0" at OUT.

Figure 3A:
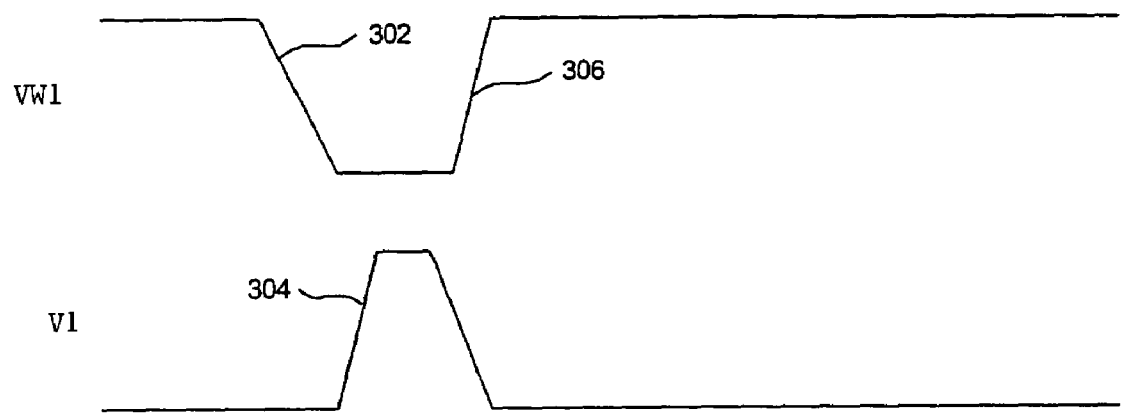
FIG. 3A illustrates a timing diagram showing the voltage at two nodes during a write operation in accordance with a second example of the present disclosure.

In a second example, the memory device will be programmed with a "0." FIG. 3A illustrates a timing diagram showing the voltage at various nodes in FIG. 1 during an operation to program the memory device with a "0." With reference to both FIGS. 1 and 3A, when the circuit is powered up, both VW0 and VW1 are at VDDH, whereas VR is at VSS. When a write operation occurs, VW1 is temporarily switched to 0 from VDDH, thereby allowing PM1 to conduct while VW0 stays at VDDH. The switch at VW1 is represented by a falling edge 302. V1 is then built up to VDDH, as represented by a rising edge 304, thereby building up carrier charges in NM3 until there is a high electric field between the drain and source of NM3. Due to hot carrier effect, the current going through NM3 becomes lower relative to that going through NM2. NM3 will now have a low conductance and a high resistance, and is considered "programmed." When VW1 is switched back to VDDH, as represented by a rising edge 306, PM1 ceases to conduct. Throughout this period, since VW0 remains at VDDH, PM0 does not conduct and therefore no hot carrier charges are built up in NM2.

Figure 3B:
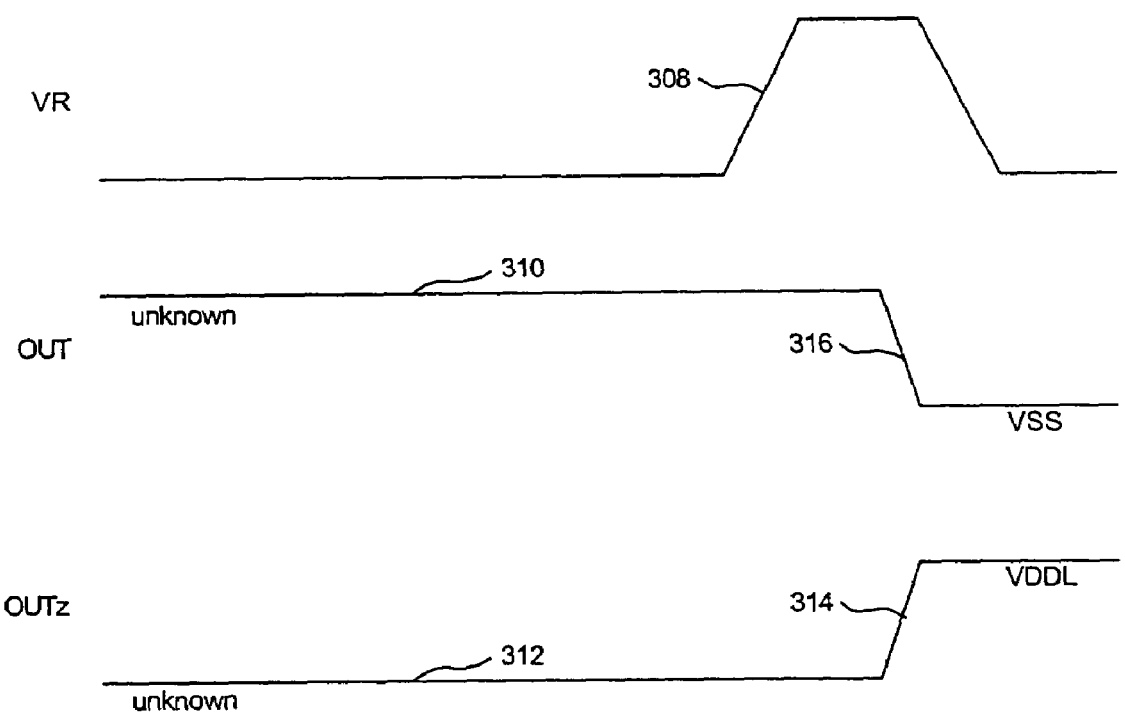
FIG. 3B illustrates a timing diagram showing the voltage at various nodes during a read operation in accordance with the second example of the present disclosure.

FIG. 3B illustrates a timing diagram showing the voltage at various nodes in FIG. 1 during a read operation in the second example. With reference to both FIGS. 1 and 3B, when a read operation occurs, VR rises, which is represented by a rising edge 308. It is noted that before a reading operation occurs, both OUT and OUTz are still indeterminate. When VR rises enough, NM0 and NM1 conduct, thereby sending V0 and V1 to OUT and OUTz, respectively. In this example, OUT, which carries V0, is lower than OUTz, which carries V1. As such, OUTz will move to as high a voltage as VDDL, as represented by a rising edge 314, while OUT stays at VSS. The data of the memory device can be obtained by reading OUT, which as represented by a falling edge 316 essentially carries the "0" since V0 is lower relative to V1 because the resistance at NM3 is higher relative to NM2.

When the VR signal is turned off, NM0 and NM1 stop conducting, thereby disconnecting OUT from V0 and OUTz from V1. At this point, since the voltage potential at OUT is lower than the voltage potential at OUTz just prior to when the VR signal is turned off, the latch 102 will force OUTz to VDDL and OUT to VSS.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

The invention claimed is:

1. A programmable metal-oxide-semiconductor (MOS) memory circuit comprising:
   a latch module having a first output and a second output based on a voltage difference between a first input and a second input;
   a first N-type transistor having a gate region tied with a drain region and connectable to a first control voltage level, and a source region connected to a second control voltage level;
   a second N-type transistor having a gate region tied with a drain region and connectable to the first control voltage level, and a source region connected to the second control voltage level; and
   a connection module for connecting the drain region of the first N-type transistor to the first input, and the drain region of the second N-type transistor to the second input,
   wherein the first and second control voltage levels are imposed to program either the first or second N-type transistor by causing a voltage difference between the drain region and the source region (Vds) and voltage difference between the gate region and the source region (Vgs) to be bigger than an operating voltage to induce a hot carrier effect, and
   wherein the first and second outputs of the latch produce voltage results representing whether the first or second N-type transistor has been programmed when the connection module is enabled.

2. The circuit of claim 1 wherein the first control voltage level is imposable through a P-type transistor to the drain region of the first or second N-type transistor.

3. The circuit of claim 2 wherein the first and second N-type transistors have thinner gate oxide layers than that of the P-type transistor.

4. The circuit of claim 1 wherein the first control voltage level is higher than the operating voltage.

5. The circuit of claim 1 wherein the second control voltage level is at a ground level.

6. The circuit of claim 1 wherein the first and second N-type transistors are thin gate oxide transistors.

7. The circuit of claim 1 wherein the first or second output of the latch is complementary to the other.

8. The circuit of claim 1 wherein the connection module has two N-type transistors with their gates connected together to a third control voltage level.

9. The circuit of claim 8 wherein the N-type transistors are thick gate oxide MOS devices.

10. A programmable thin gate oxide N-type MOS memory device comprising:
    a gate region tied with a drain region and connectable to a first control voltage level;
    a source region connected to a second control voltage level,
    wherein the first and second control voltage levels are imposed to cause a voltage difference between the drain region and the source region (Vds) and voltage difference between the gate region and the source region (Vgs) of the device to be bigger than a predetermined threshold voltage to cause a hot carrier effect for increasing the resistance thereof so that the device functions as a one-time programmable fuse.

11. The device of claim 10 wherein the first control voltage level is 3.3V.

12. The device of claim 10 wherein the threshold voltage is 1.2V.

13. A programmable metal-oxide-semiconductor (MOS) memory circuit comprising:
    a first N-type thin gate oxide transistor having a gate region tied with a drain region and connectable to a first control voltage level, and a source region connected to a second voltage level; and
    a second N-type thin gate oxide transistor having a gate region tied with a drain region and connectable to the first control voltage level, and a source region connected to the second voltage level,
    wherein the first and second control voltage levels are imposed to program either the first or second N-type thin gate oxide transistor by causing a voltage difference between the drain region and the source region (Vds) and voltage difference between the gate region and the source region (Vgs) to be bigger than a predetermined threshold voltage to induce a hot carrier effect.

14. The circuit of claim 13 further comprising:
    a latch module having a first output and a second output based on a voltage difference between a first input and a second input,
    wherein the first and second inputs are connectable to the drain regions of the first and second N-type thin gate oxide transistors to generate the first and second outputs of the latch representing whether the first or second N-type thin gate oxide transistor has been programmed.

15. The circuit of claim 14 further comprising a connection module having two N-type thick gate oxide transistors with their gates connected together to a third control voltage for connecting the drain region of the first N-type thin gate oxide transistor to the first input of the latch, and the drain region of the second N-type thin gate oxide transistor to the second input of the latch.

16. The circuit of claim 13 further comprising a P-type thick gate oxide transistor connecting the first voltage level to the drain region of the first or second N-type thin gate oxide transistor.

* * * * *